United States Patent
Shibata et al.

(10) Patent No.: US 8,519,602 B2
(45) Date of Patent: Aug. 27, 2013

(54) PIEZOELECTRIC THIN FILM ELEMENT AND PIEZOELECTRIC THIN FILM DEVICE USING A PIEZOELECTRIC THIN FILM OF ALKALI-NIOBIUM OXIDE SERIES

(75) Inventors: Kenji Shibata, Tsukuba (JP); Kazufumi Suenaga, Tsuchiura (JP); Akira Nomoto, Kasumigaura (JP); Kazutoshi Watanabe, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 372 days.

(21) Appl. No.: 13/006,842

(22) Filed: Jan. 14, 2011

(65) Prior Publication Data
US 2011/0175488 A1 Jul. 21, 2011

(30) Foreign Application Priority Data

Jan. 18, 2010 (JP) ................................ 2010-007942

(51) Int. Cl.
*H01L 41/187* (2006.01)
(52) U.S. Cl.
USPC . 310/358; 501/134; 252/62.9 R; 252/62.9 PZ
(58) Field of Classification Search
USPC ................... 310/358; 252/62.9 R; 501/134, 501/135
See application file for complete search history.

(56) References Cited

U.S. PATENT DOCUMENTS

| 6,347,862 | B1 | 2/2002 | Kanno et al. | |
| 7,576,477 | B2* | 8/2009 | Koizumi et al. | 310/365 |
| 8,310,135 | B2* | 11/2012 | Suenaga et al. | 310/358 |
| 8,316,519 | B2* | 11/2012 | Kimura et al. | 29/25.35 |
| 2004/0127344 | A1* | 7/2004 | Sato et al. | 501/134 |
| 2007/0271750 | A1* | 11/2007 | Hamada et al. | 29/25.01 |
| 2008/0308762 | A1* | 12/2008 | Ueno et al. | 252/62.9 R |
| 2009/0075066 | A1* | 3/2009 | Shibata et al. | 428/332 |
| 2009/0096328 | A1* | 4/2009 | Shibata et al. | 310/346 |

FOREIGN PATENT DOCUMENTS

| JP | 10286953 A | 10/1998 |
| JP | 2007-019302 | 1/2007 |

OTHER PUBLICATIONS

T.Mino, S. Kuwajima, T.Suzuki, I.Kanno, H.Kotera, and K.Wasa, Jpn. J. Appl. Phys., 46(2007), 6960-6963.

* cited by examiner

*Primary Examiner* — J. San Martin
(74) *Attorney, Agent, or Firm* — Marty Fleit; Paul D. Bianco; Fleit Gibbons Gutman Bongini Bianco PL

(57) ABSTRACT

To provide a piezoelectric thin film on a substrate, having an alkali-niobium oxide-based perovskite structure expressed by a composition formula $(K_{1-x}Na_x)_yNbO_3$, wherein the composition ratio x of the piezoelectric thin film expressed by $(K_{1-x}Na_x)_yNbO_3$ is in a range of $0.4 \leqq x \leqq 0.7$, and a half width of a rocking curve of (001) plane by X-ray diffraction measurement is in a range of 0.5° or more and 2.5° or less.

7 Claims, 8 Drawing Sheets

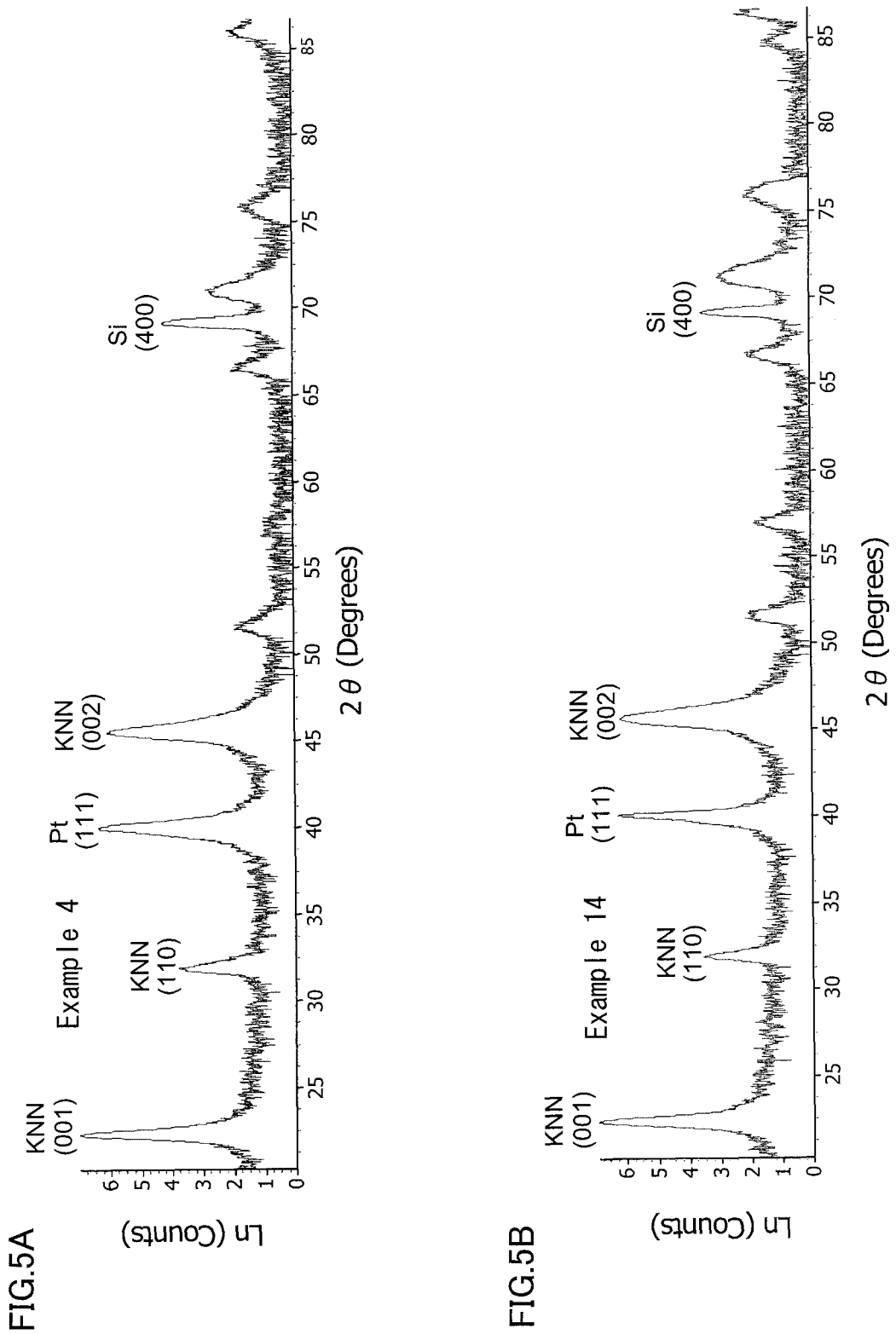

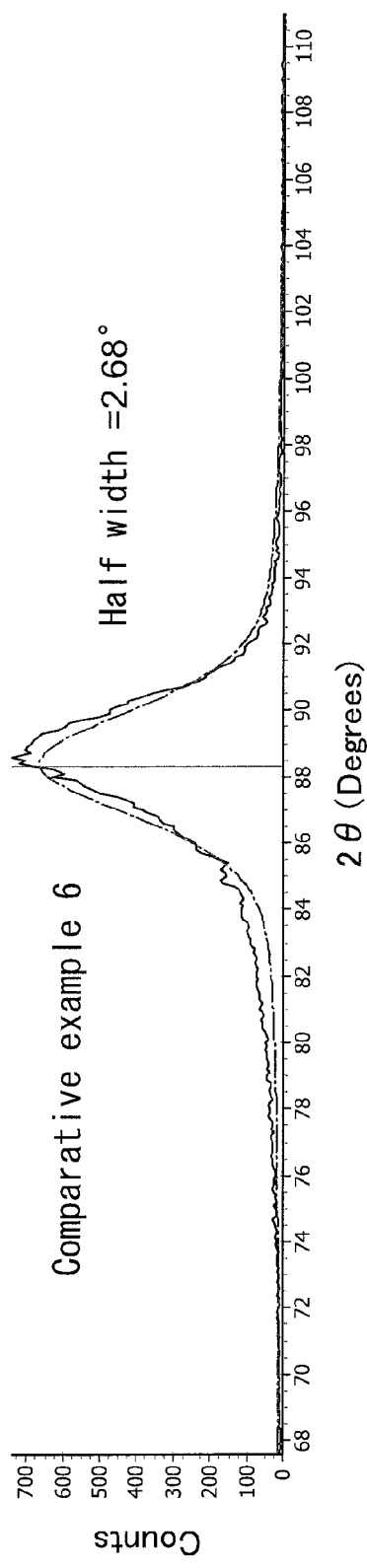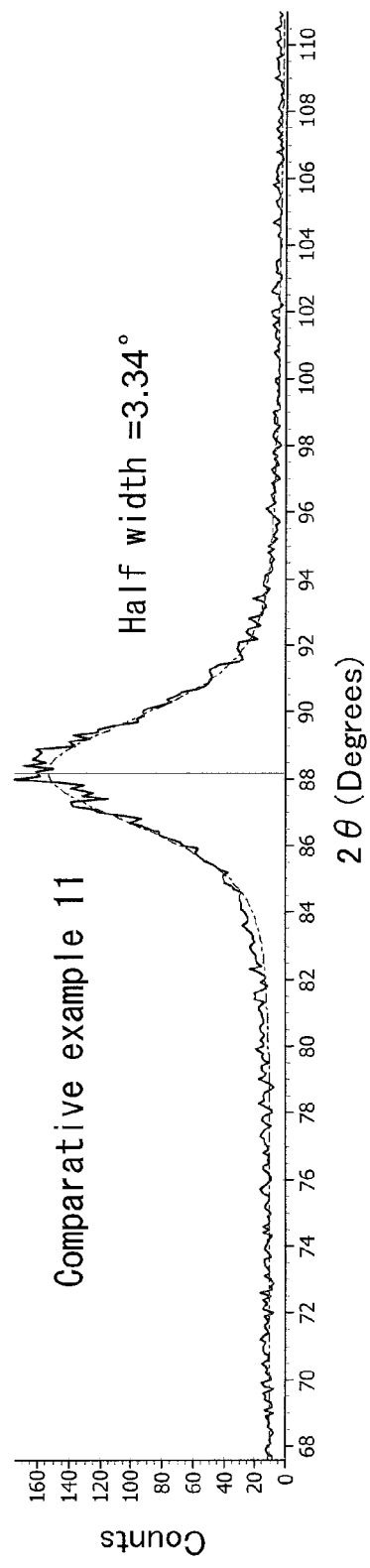
FIG.8A
FIG.8B

PIEZOELECTRIC THIN FILM ELEMENT AND PIEZOELECTRIC THIN FILM DEVICE USING A PIEZOELECTRIC THIN FILM OF ALKALI-NIOBIUM OXIDE SERIES

The present application is based on Japanese Patent Application No. 2010-007942, filed on Jan. 18, 2010, the entire contents of which are hereby incorporated by reference.

BACKGROUND OF THE INVENTION

1. Field of the Invention

The present invention relates to a piezoelectric thin film element and a piezoelectric thin film device, using a piezoelectric thin film of alkali-niobium oxide series.

2. Description of the Related Art

A piezoelectric ceramics is processed into various piezoelectric elements in accordance with various purposes, and is widely used particularly as a functional electronic component such as an actuator for generating deformation by adding a voltage to the piezoelectric elements, and a sensor for detecting the voltage generated by deformation of the piezoelectric elements. As the piezoelectric ceramics used for the purpose of use of the actuator and the sensor, a dielectric material, being a lead-based material, having excellent piezoelectric properties, and particularly a PZT-based perovskite-type ferroelectric ceramics expressed by a composition formula: $Pb(Zr_{1-x}Ti_x)O_3$ is widely known heretofore. PZT-based piezoelectric ceramics is ordinarily formed by sintering an oxide of each of the elements. With a progress of miniaturization and high performance of each kind of electronic component, the miniaturization and high performance of the piezoelectric elements are also strongly requested.

However, in a piezoelectric material fabricated by a sintering method, being a conventional method, as a thickness thereof becomes smaller, particularly as the thickness becomes nearly about 10 μm, a thickness of the piezoelectric thin film corresponds to almost a size of each crystal grain constituting the thin film, and an influence on the piezoelectric properties, etc, can not be ignored. Therefore, there is a problem that variation or deterioration of properties is remarkable. Therefore, in order to prevent such a problem, a forming method of the piezoelectric ceramics using a thin film technique instead of the sintering method, has been studied in recent years. Recently, a PZT thin film formed on a silicon substrate by sputtering has been put to practical use as a piezoelectric thin film of an actuator for an ink jet printer head with high-speed and high-definition (for example, see patent document 1).

Meanwhile, a piezoelectric sintered ceramics or a piezoelectric thin film made of PZT contains lead by about 60 to 70 wt %, and therefore is not preferable in terms of an ecological viewpoint and pollution control. Therefore, in consideration of an environment, development of the piezoelectric materials not containing lead is desired. At present, various lead-free piezoelectric materials are studied, including potassium sodium niobate (also described as "KNN" hereafter) expressed by a composition formula $(K_{1-x}Na_x)NbO_3 (0<x<1)$, composed of K (potassium), Na (sodium), Nb (niobium), and O (oxygen). The KNN is a material having a perovskite structure and shows relatively excellent piezoelectric properties for a lead-free material, and therefore is expected as a strong candidate of a lead-free piezoelectric material (for example, see patent document 2).

PATENT DOCUMENT 1

Japanese Patent Laid Open Publication No. 1998-286953

PATENT DOCUMENT 2

Japanese Patent Laid Open Publication No. 2007-19302

However, in a conventional KNN thin film having a high piezoelectric constant, leak current flows frequently between an upper electrode and a lower electrode disposed on top and bottom sides of the KNN thin film. Namely, there is a problem that an insulating performance of the KNN thin film is reduced. Although depending on the kind and specification of a device using a piezoelectric thin film, when a general actuator is applied, it is said that the leak current at the time of applied electric field of 50 kV/cm² between the upper and lower electrodes, needs to be $1.0 \times 10^{-7}$ A/cm² or less. Also, when an actuator is fabricated by using the piezoelectric thin film, there is also a problem that the piezoelectric constant is gradually decreased by multiple number of times of piezoelectric actuations. Although depending on the device and specification using a piezoelectric thin film, generally, when the piezoelectric constant at initial time is set as a reference, it is said that a deterioration rate of the piezoelectric constant needs to be less than 10% after drive of one hundred million number of times.

BRIEF SUMMARY OF THE INVENTION

An object of the present invention is to provide a piezoelectric thin film element having a small leak current, and having a small deterioration of a piezoelectric constant by driving, and a piezoelectric thin film device using the piezoelectric thin film element.

According to an aspect of the present invention, a piezoelectric thin film element is provided, comprising:

a piezoelectric thin film on a substrate, having an alkali-niobium oxide-based perovskite structure expressed by a composition formula $(K_{1-x}Na_x)_yNbO_3$, wherein the composition ratio x of the piezoelectric thin film expressed by $(K_{1-x}Na_x)_yNbO_3$ is in a range of $0.4 \leq x \leq 0.7$, and a half width of a rocking curve of (001) plane by X-ray diffraction measurement is in a range of 0.5° or more and 2.5° or less.

According to other aspect of the present invention, a piezoelectric thin film device is provided, comprising:

a lower electrode provided on a substrate;

a piezoelectric thin film provided on the lower electrode, having an alkali-niobium oxide-based perovskite structure expressed by a composition formula $(K_{1-x}Na_x)_yNbO_3$, with the composition ratio x being in a range of $0.4 \leq x \leq 0.7$, and a half width of a rocking curve of (001) plane by X-ray diffraction measurement being in a range of 0.5° or more and 2.5° or less;

an upper electrode provided on the piezoelectric thin film; and a function generator or a voltage detection unit connected between the lower electrode and the upper electrode.

BRIEF DESCRIPTION OF THE DRAWINGS

FIG. 5A is a view showing an X-ray diffraction pattern (2θ/θ scan) of the piezoelectric thin film element of example 4.

FIG. 5B is a view showing the X-ray diffraction pattern (2θ/θ scan) of the piezoelectric thin film element of example 14.

FIG. 8A is a view showing the rocking curve (ω scan) of KNN (001) plane by X-ray diffraction measurement of the piezoelectric thin film element of comparative example 6.

FIG. 8B is a view showing the rocking curve (ω scan) of KNN (001) plane by X-ray diffraction measurement of the piezoelectric thin film element of comparative example 11.

DETAILED DESCRIPTION OF THE INVENTION

Preferred embodiments of a piezoelectric thin film and a piezoelectric thin film device according to the present invention will be described hereafter.

Piezoelectric Thin Film Element According to an Embodiment

Figure 1:
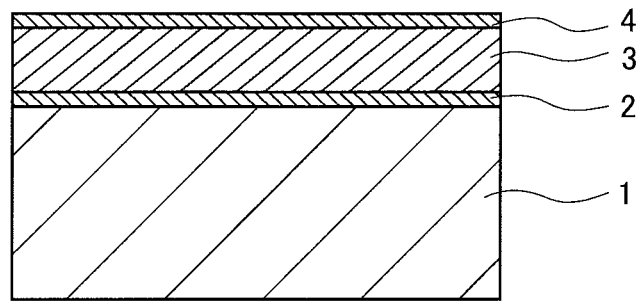
FIG. 1 is a cross-sectional view showing a structure of a piezoelectric thin film element according to an embodiment of the present invention.

FIG. 1 is a cross-sectional view showing a structure of a piezoelectric thin film element according to an embodiment of the present invention.

As shown in FIG. 1, the piezoelectric thin film element has a structure in which lower electrode 2, piezoelectric thin film 3 having an alkali-niobium oxide-based perovskite structure expressed by a composition formula $(K_{1-x}Na_x)_yNbO_3$ (abbreviated as "KNN" hereafter), and upper electrode 4 are sequentially formed on substrate 1.

As the substrate 1, Si (silicon) substrate, Si substrate with a surface oxide film having an oxide film on a surface of the Si substrate, or SOI (Silicon On Insulator) substrate is preferably used. As the Si substrate, for example, (100) plane Si substrate is used, with a surface of the Si substrate oriented to (100) plane direction. However, the Si substrate with plane direction different from (100) plane may also be used. Further, as the substrate 1, a quartz glass substrate, a GaAs substrate, a sapphire substrate, and a metal substrate such as a stainless substrate, a MgO substrate, and a $SrTiO_3$ substrate, etc, may also be used.

The lower electrode 2 is made of Pt (platinum), and Pt electrode with Pt film preferentially oriented to (111) plane direction is preferable. The Pt film formed on the Si substrate is easily oriented to (111) plane direction, due to self-orientation tendency. Further, the Pt film self-oriented to (111) plane direction is formed into a polycrystal of a columnar structure, and therefore the piezoelectric thin film 3 formed on the Pt film also follows after the crystal structure of the Pt film and is formed into a thin film of a polycrystal structure of columnar structure. As a material of the lower electrode 2, an alloy containing Pt, Au (gold), Ru (ruthenium), Ir (iridium), or metal oxides such as $SrRuO_3$ and $LaNiO_3$, may also be used other than Pt. The lower electrode 2 is formed by using sputtering and vapor deposition, etc. Note that an adhesive layer may also be provided between the substrate 1 and the lower electrode 2, to thereby increase adhesiveness of the lower electrode 2.

In the piezoelectric thin film 3, the composition ratio x, being the ratio Na/(K+Na) is in a range of $0.4 \leq x \leq 0.7$, and the half width (the half width is a Full Width at Half Maximum (FWHM)) of the rocking curve (ω scan) of the KNN (001) plane by X-ray diffraction measurement is in a range of 0.5° or more and 2.5° or less. Further, the piezoelectric thin film 3 has a pseudo-cubic crystal structure, and is preferably preferentially oriented to (001) plane direction. Moreover, in the piezoelectric thin film 3, a film thickness is preferably set to 1 μm or more and 10 μm or less, and a mean particle size of grains (crystal grains) constituting the KNN thin film is preferably set to 0.05 μm or more and 1.0 μm or less. As a formation method of the piezoelectric thin film 3, sputtering, CVD (Chemical Vapor Deposition), PLD (Pulsed Laser Deposition), and Sol-Gel method, etc, can be given.

Similarly to the lower electrode 2, the upper electrode 4 is made of Pt and Au etc., and may be formed by using the sputtering, vapor deposition, plating, and metal pasting, etc. The material of the upper electrode 4 is not particularly limited.

A plurality of piezoelectric thin film elements wherein the composition ratio x of the $(K_{1-x}Na_x)NbO_3$ piezoelectric thin film 3 is in a range of $0.4 \leq x \leq 0.7$, and the piezoelectric thin film 3 has a pseudo-cubic crystal structure, and is preferentially oriented to (001) plane direction, were experimentarily made and properties thereof were evaluated. As a result, it was found that there was a close relation between a magnitude of the leak current between the upper electrode 4 and the lower electrode 2 and a deterioration rate of the piezoelectric constant after driving the piezoelectric thin film element multiple number of times, and the half width of the rocking curve (ω scan) of (001) plane by X-ray diffraction measurement of the KNN thin film.

Specifically, it was found that the leak current was large when the half width of the rocking curve of the KNN (001) plane by X-ray diffraction measurement was smaller than 0.5°, and the deterioration rate of the piezoelectric constant after drive was large when the half width was larger than 2.5°. Therefore, it was found that the piezoelectric thin film element could be realized wherein the leak current was small and the deterioration rate of the piezoelectric constant after drive was also small, when the half width of the rocking curve of the (001) plane of the KNN thin film was 0.5° or more and 2.5° or less.

The leak current of the piezoelectric thin film element and the deterioration rate of the piezoelectric constant after drive are varied, depending on the value of the half width of the rocking curve of the KNN (001) plane by X-ray diffraction measurement, and the reason therefore will be explained next.

Figure 4A:
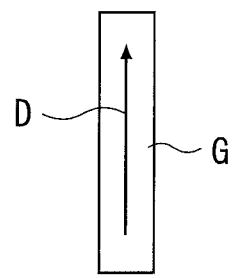
FIG. 4A, FIG. 4B, and FIG. 4C are views for explaining each relation between half widths of rocking curves of (001) planes of a KNN thin films, and states of grains of the KNN thin films and characteristics of the KNN thin films.
Figure 4B:
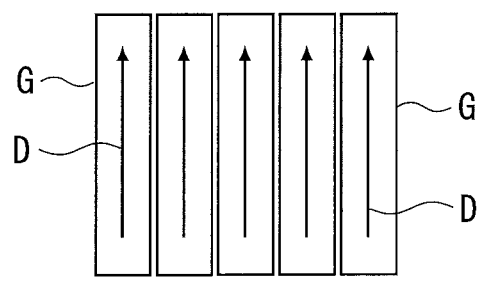
Figure 4C:
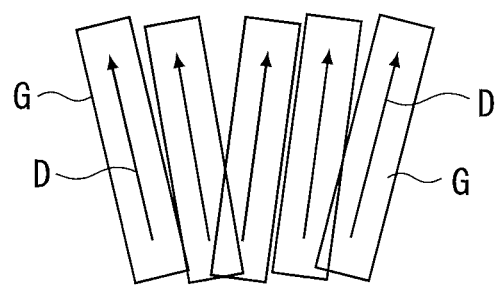

FIG. 4A, FIG. 4B, and FIG. 4C show the relation between the half width of the rocking curve of the (001) plane of the KNN thin film, and a crystal state of the KNN thin film. The KNN thin film with the composition ratio x being in a range of $0.4 \leq x \leq 0.7$, and the crystal structure being the pseudo-cubic crystal structure, and preferentially oriented to (001) plane direction, is formed into a polycrystal mainly constituted of columnar grains (columnar crystal grains) G having the perovskite structure as shown in FIG. 4A, FIG. 4B, and FIG. 4C. Here, as shown in FIG. 4A, the columnar crystal grain G is a vertically long single crystal that grows to be long and narrow in a vertical direction D (shown by arrow in the figure) with respect to the (001) plane.

In the polycrystal with small half width of the rocking curve of the KNN (001) plane, as shown in FIG. 4B, the directions D of each columnar grain G is set in an aligned state. In this state, boundaries (grain boundaries) between adjacent grains G are aligned, thus easily generating the leak current. Further, piezoelectric actuation is performed by expanding and contracting the grains G in the direction D vertical to the (001) plane. Therefore, in a state that the directions D of the columnar grains G are aligned, the piezoelectric actuation is performed by expanding and contracting all grains G similarly, and therefore excessive load is not imposed. Thus, the deterioration of the piezoelectric constant is small after drive of multiple number of times and a long service life is achieved.

In the polycrystal with large half width of the rocking curve of the KNN (001) plane, as shown in FIG. 4C, the direction D of each columnar grain G is in a dispersed state. In this state, the boundaries between the adjacent grains G are disturbed, thus making it difficult to cause the leak current. Further, in a dispersed state of the directions D of the columnar grains G, the piezoelectric actuation is performed by expanding and contracting the grains G in slightly different directions, and therefore excessive load is imposed locally. Thus, the deterioration of the piezoelectric constant is increased after drive of multiple number of times, and the service life is shortened.

For the reason described above, by setting the half width of the rocking curve of the KNN (001) plane in a range of 0.5° or more and 2.5° or less, both problems of the leak current and decrease of the piezoelectric constant after piezoelectric actuation, can be improved, in the KNN thin film having high piezoelectric constant.

In a film deposition method by RF magnetron sputtering performed in a state of heating the substrate 1, which is mainly studied and experimented by us, it is found that the half width of the rocking curve of the (001) plane of the KNN thin film is strongly influenced by intensity of a magnetic field of a surface of the target (specifically, distance between the target and a magnet installed under the target), and an orientation state of the (111) plane of the Pt lower electrode 2.

In sputter machines used by us, the half width of the rocking curve of the (001) plane tends to be small by reducing a surface magnetic field of the target. Further, when the (111) orientation of the Pt lower electrode 2 is high, the half width of the rocking curve of the (001) plane tends to be small. The range of 0.5° or more and 2.5° or less of the half width of the rocking curve of the KNN (001) plane defined by the present invention, can be realized by controlling and adjusting the intensity of the surface magnetic field of the target (distance between the target and the magnet installed under the target).

Samarium-cobalt ($Sm_2Co_{17}$) was used in the magnet. Also, the above-described range can be realized by changing an orientation state of the (111) plane of the Pt lower electrode 2. High orientation of the Pt thin film, being the Pt lower electrode, to the (111) plane direction, is realized by raising a film deposition temperature of the Pt thin film by sputtering, making $O_2$ partial pressure small (0.1% or less of the $O_2$ partial pressure) during film deposition of the Pt thin film by sputtering, and making a thickness of a Ti adhesive layer small when the Ti adhesive layer under the Pt thin film is provided.

Piezoelectric Thin Film Element According to Other Embodiment

Figure 2:
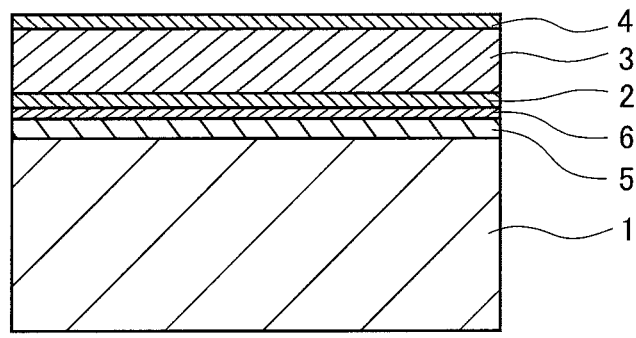
FIG. 2 is a cross-sectional view showing a structure of a piezoelectric thin film element according to other embodiment of the present invention.

FIG. 2 shows a cross-sectional structure of the piezoelectric thin film element according to other embodiment of the present invention. Similarly to the piezoelectric thin film element according to the embodiment shown in FIG. 1, this piezoelectric thin film element has the lower electrode 2, the piezoelectric thin film 3, and the upper electrode 4 on the substrate 1, and as shown in FIG. 2, the substrate 1 is the substrate with a surface oxide film wherein an oxide film 5 is formed on its surface, and an adhesive layer 6 for enhancing adhesiveness of the lower electrode 2 is provided between the oxide film 5 and the lower electrode 2.

The substrate 1 with oxide film, is for example, a Si substrate with oxide film. In the Si substrate with oxide film, the oxide film 5 includes $SiO_2$ film formed by thermal oxidization and Si oxide film formed by CVD. Further, the adhesive layer 6 is formed by sputtering, etc, using Ti (titanium) and Ta (tantalum), etc.

Note that the piezoelectric thin film 3 of the piezoelectric thin film element described in the aforementioned embodiments, is the KNN thin film of a single layer satisfying $0.4 \leq x \leq 0.7$, with the half width of the rocking curve of the (001) plane in a range of 0.5° or more and 2.5° or less. However, in the piezoelectric thin film 3, a plurality of layers of KNN thin film formed within the aforementioned range may be provided, or a thin film having the perovskite structure such as KNN thin film not within the aforementioned range may also be provided, other than the KNN thin film in the above range. Further, elements other than K (potassium), Na (sodium), Nb (niobium), O (oxygen), for example, Li (lithium), Ta (tantalum), Sb (antimony), Ca (calcium), Cu (copper), Ba (barium), Ti (titanium), etc, may be added by 5 atoms % or less, to the piezoelectric thin film 3 of KNN, and in this case as well, similar effects can be obtained.

Further, by depositing the film so that the composition ratio (K+Na)/Nb of the KNN piezoelectric thin film is 0.7 or more and 0.94 or less, excellent properties can be obtained.

Ordinarily, the KNN film having a stoichiometric composition wherein (K+Na)/Nb=1, or a composition close to the stoichiometric composition, is fabricated. However, this time, when the KNN film with less K and Na than that of the KNN film near the stoichiometric composition is intentionally fabricated, it is found that the piezoelectric constant is larger than that of the KNN film near the stoichiometric composition. Although details of a mechanism of improving the piezoelectric constant is not clear, it can be estimated that by setting the composition ratio of (K+Na)/Nb smaller than 1, moderate destabilizing factor is introduced to the KNN film of the stoichiometric composition, which is ideal as a crystal, thus easily allowing expansion/compression of crystal lattices (piezoelectric actuation) to occur by the electric field. The KNN thin film with the composition ratio (K+Na)/Nb set to 0.7 or more and 0.94 or less, has a perovskite pseudo-cubic crystal structure, and is preferentially oriented to (001) plane direction. Note that when the composition ratio (K+Na)/Nb is smaller than 0.7, the insulating performance of the KNN film is remarkably deteriorated, thus tremendously increasing the leak current. Therefore, it is found that utilization as the piezoelectric thin film element is difficult.

A method of fabricating the KNN thin film with composition ratio (K+Na)/Nb set to 0.7 or more and 0.94 or less, includes a method of applying sputtering using a target with less K and Na compared with the stoichiometric composition, namely, using a target with (K+Na)/Nb smaller than 1. Further, even when using the target near (K+Na)/Nb=1, the KNN thin film can be fabricated by setting a substrate temperature during film deposition by sputtering to be a slightly higher temperature (for example, 700° C. or more) than a generally used temperature.

[Piezoelectric Thin Film Device Using the Piezoelectric Thin Film Element]

Figure 3:
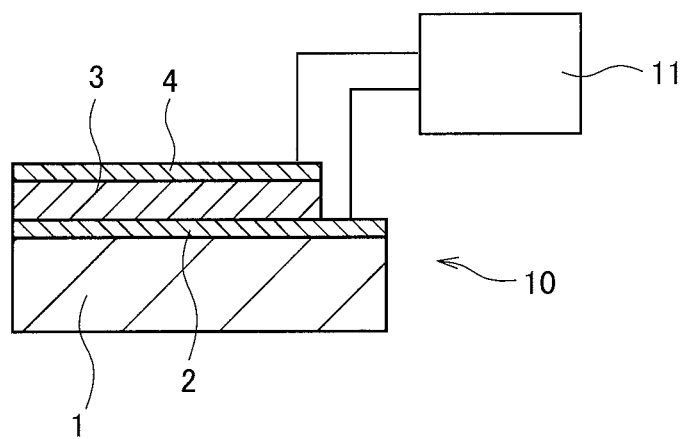
FIG. 3 is a configuration diagram showing a piezoelectric thin film device according to an embodiment of the present invention.

FIG. 3 shows a configuration diagram of the piezoelectric thin film device according to an embodiment of the present invention. As shown in FIG. 3, in the piezoelectric thin film device, at least a voltage detection unit or a function generator 11 is connected between the lower electrode 2 and the upper electrode 4 of the piezoelectric thin film element 10 formed into a prescribed shape.

By connecting the voltage detection unit 11 between the lower electrode 2 and the upper electrode 4, a sensor, being the piezoelectric thin film device, can be obtained. When the piezoelectric thin film element 10 of this sensor is deformed with a change of a certain physical quantity, a voltage is generated by this deformation. Therefore, each kind of physical quantity can be measured by detecting the voltage by the voltage detection unit 11. For example, a gyroscope, an ultrasonic sensor, a pressure sensor, a speed sensor, an acceleration sensor, etc, can be given as the sensor.

Further, by connecting the function generator 11 between the lower electrode 2 and the upper electrode 4 of the piezoelectric thin film element 10, an actuator, being the piezoelectric thin film device, can be obtained. Each kind of member can be actuated by applying voltage to the piezoelectric thin film element 10 of the actuator and deforming the piezoelectric thin film element 10. The actuator can be used, for example, in an inkjet printer, a scanner, and an ultrasonic wave generator, etc.

Note that the piezoelectric thin film element of the present invention can be applied to a surface acoustic wave device, etc.

EXAMPLES

Next, examples of the present invention will be described.

The piezoelectric thin film element of examples 1 to 20 and comparative examples 1 to 14 has a cross-sectional structure similar to the embodiment shown in FIG. 2, and Ti adhesive layer, Pt lower electrode, KNN piezoelectric thin film, and Pt upper electrode are laminated on the Si substrate having a thermal oxide film.

[Film Deposition of the KNN Thin Film]

A film deposition method of the KNN piezoelectric thin film according to examples and comparative examples will be described hereafter.

Si substrate with thermal oxide film was used as the substrate ((100) plane orientation, thickness: 0.525 mm, size: 20 mm×20 mm, thickness of the thermal oxide film: 200 nm). First, Ti adhesive layer (film thickness: 2 nm) and Pt lower electrode ((111) plane preferential orientation, film thickness: 200 nm) were formed on the substrate by RF magnetron sputtering. The Ti adhesive layer and the Pt lower electrode were formed under conditions of a substrate temperature: 100 to 350° C., discharge power: 200 W, introduction gas: Ar, pressure of Ar atmosphere: 2.5 Pa, film deposition time: 1-3 minutes for the Ti adhesive layer, and 10 minutes for the Pt lower electrode.

Subsequently, 3 μm of $(K_{1-x}Na_x)_yNbO_3$ thin film was formed on the Pt lower electrode by RF magnetron sputtering. $(K_{1-x}Na_x)_yNbO_3$ piezoelectric thin film was formed by using $(K_{1-x}Na_x)_yNbO_3$ sintered ceramics with ratios of Na/(K+Na)=0.425 to 0.730 as a target, under conditions of substrate temperature: 700° C., discharge power: 100 W, introduction gas: Ar, and pressure of the Ar atmosphere: 1.3 Pa. The film deposition time of the KNN film by sputtering was adjusted so that the film thickness was almost 3 μm. The half width of the rocking curve of the KNN (001) of the KNN thin film was controlled by changing each distance between the magnet that exists under the target and the target, in a range of 15 mm to 35 mm.

Table 1 shows a list of the composition ratio x (x=Na/(K+Na)) of the KNN thin film (calculated from a measurement value of a percentage of the atoms % of K and Na by EDX (Energy Dispersive X-ray Spectroscopy)), distance (mm) between a magnet surface and a target surface, half width (°) of the rocking curve of the KNN (001), piezoelectric constant $d_{31}$(−pm/V), leak current ($×10^{−7}$ A/cm$^2$) during applied electric field of 50 kV/cm to the KNN thin film, and the deterioration rate (%) of the piezoelectric constant $d_{31}$ after drive of one hundred million number of times.

TABLE 1

|  | Composition ratio X Na/(K + Na) | Distance (mm) | Half width (degree) | $d_{31}$ (-pm/V) | Leak current ($×10^{−7}$ A/cm$^2$) | Deterioration rate (%) |
|---|---|---|---|---|---|---|
| Comparative example 1 | 0.495 | 15.0 | 0.22 | 87 | 11.0 | 8 |
| Comparative example 2 | 0.475 | 17.5 | 0.25 | 90 | 6.7 | 6 |
| Comparative example 3 | 0.670 | 15.0 | 0.31 | 94 | 5.6 | 7 |
| Comparative example 4 | 0.691 | 15.0 | 0.45 | 95 | 3.5 | 5 |
| Example 1 | 0.648 | 17.5 | 0.50 | 95 | 0.5 | 5 |
| Example 2 | 0.468 | 20.0 | 0.70 | 94 | 0.6 | 6 |
| Example 3 | 0.638 | 17.5 | 0.80 | 98 | 0.4 | 7 |
| Example 4 | 0.425 | 20.0 | 0.82 | 92 | 0.6 | 3 |
| Example 5 | 0.666 | 22.5 | 0.90 | 96 | 0.7 | 4 |
| Example 6 | 0.650 | 17.5 | 1.12 | 93 | 0.9 | 6 |
| Example 7 | 0.516 | 22.5 | 1.13 | 91 | 1.0 | 5 |
| Example 8 | 0.598 | 20.0 | 1.23 | 96 | 0.9 | 7 |
| Example 9 | 0.400 | 22.5 | 1.32 | 100 | 0.8 | 4 |

TABLE 1-continued

|  | Composition ratio X Na/(K + Na) | Distance (mm) | Half width (degree) | $d_{31}$ (-pm/V) | Leak current ($\times 10^{-7}$ A/cm$^2$) | Deterioration rate (%) |
|---|---|---|---|---|---|---|
| Example 10 | 0.648 | 20.0 | 1.33 | 91 | 0.7 | 3 |
| Example 11 | 0.413 | 25.0 | 1.62 | 94 | 0.8 | 6 |
| Example 12 | 0.619 | 27.5 | 1.78 | 100 | 0.5 | 7 |
| Example 13 | 0.650 | 22.5 | 1.98 | 99 | 0.9 | 8 |
| Example 14 | 0.640 | 27.5 | 2.16 | 95 | 1.0 | 5 |
| Example 15 | 0.672 | 25.0 | 2.28 | 94 | 0.9 | 4 |
| Example 16 | 0.444 | 30.0 | 2.29 | 100 | 0.6 | 3 |
| Example 17 | 0.444 | 25.0 | 2.31 | 102 | 0.9 | 5 |
| Example 18 | 0.557 | 30.0 | 2.37 | 98 | 0.8 | 4 |
| Example 19 | 0.553 | 27.5 | 2.49 | 101 | 0.7 | 8 |
| Example 20 | 0.436 | 30.0 | 2.50 | 102 | 0.9 | 9 |
| Comparative example 5 | 0.526 | 32.5 | 2.58 | 100 | 1.0 | 16 |
| Comparative example 6 | 0.691 | 32.5 | 2.68 | 103 | 0.9 | 17 |
| Comparative example 7 | 0.675 | 30.0 | 2.70 | 99 | 0.8 | 22 |
| Comparative example 8 | 0.681 | 32.5 | 2.88 | 105 | 0.7 | 30 |
| Comparative example 9 | 0.433 | 35.0 | 2.89 | 103 | 0.9 | 33 |
| Comparative example 10 | 0.609 | 30.0 | 3.11 | 109 | 1.0 | 31 |
| Comparative example 11 | 0.578 | 32.5 | 3.34 | 101 | 0.7 | 35 |
| Comparative example 12 | 0.588 | 35.0 | 4.31 | 104 | 0.8 | 34 |
| Comparative example 13 | 0.700 | 32.5 | 4.36 | 104 | 0.9 | 45 |
| Comparative example 14 | 0.647 | 35.0 | 4.40 | 106 | 0.8 | 40 |

In the examples, the manufacturing condition in a case of example 12 will be described next, as an example of a further specific manufacturing condition.

Si substrate: (100) plane, thickness 0.525 mm, size 20×20 mm, thermal oxide film 200 nm Ti adhesive layer: 2 nm Pt lower electrode: 200 nm, (111) orientation Film deposition conditions of the Ti adhesive layer and Pt lower electrode: substrate temperature 150° C., discharge power 200 W, 100% Ar atmosphere, Ar pressure 2.5 Pa KNN piezoelectric thin film: 3 μm, (001) orientation, Na/(K+Na)=0.619, (K+Na)/Nb=0.880

Film deposition conditions of KNN piezoelectric thin film: target composition Na/(K+Na)=0.650, (K+Na)/Nb=1.000, substrate temperature 700° C., discharge power 100 W, 100% Ar atmosphere, Ar pressure 1.3 Pa, magnet-target distance 27.5 mm, target-substrate distance 100 mm, use of samarium cobalt magnet

[X-Ray Diffraction Measurement of KNN Thin Film (2θ/θ Scan)]

Figure 6A:
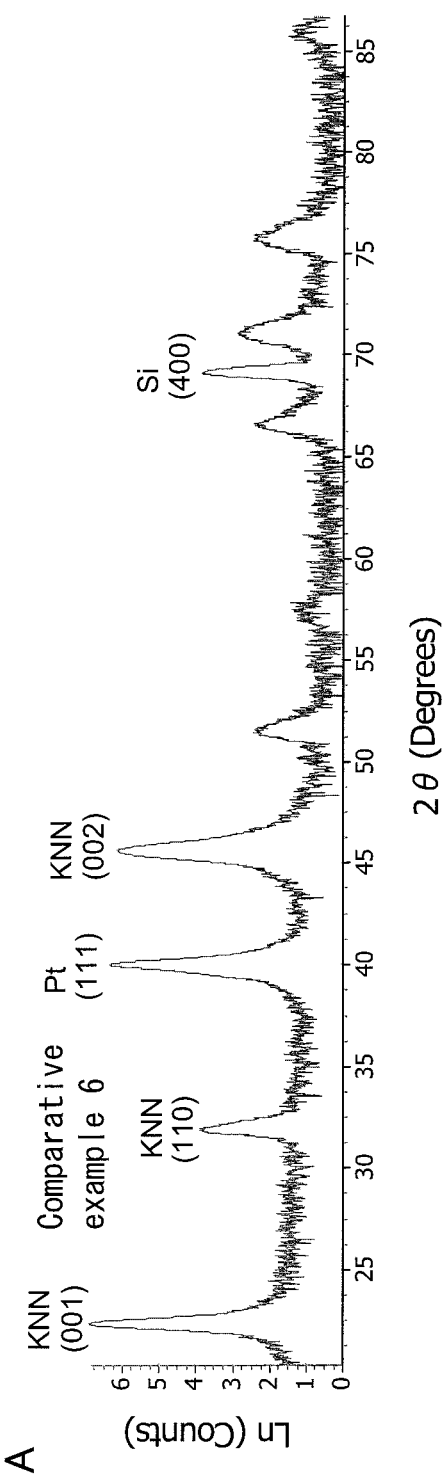
FIG. 6A is a view showing an X-ray diffraction pattern (2θ/θ scan) of the piezoelectric thin film element of comparative example 6.
Figure 6B:
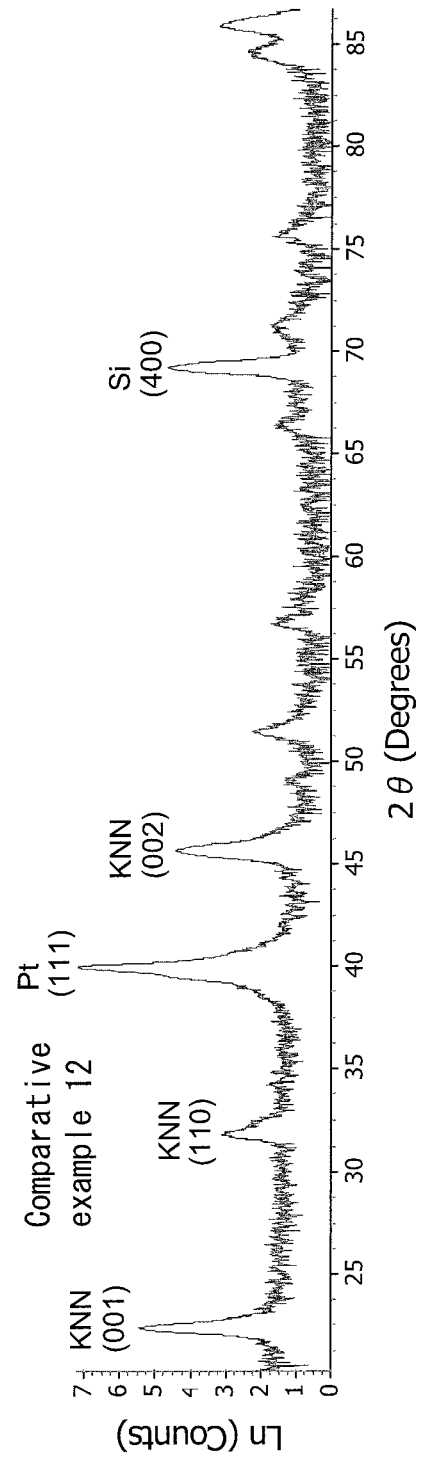
FIG. 6B is a view showing the X-ray diffraction pattern (2θ/θ scan) of the piezoelectric thin film element of comparative example 12.

X-ray diffraction measurement (2θ/θ scan) was performed to the KNN thin film of examples 1 to 20 and comparative examples 1 to 14 formed as described above, to thereby examine a crystal structure and an orientation state. As an example, an X-ray diffraction pattern of example 4 is shown in FIG. 5A, and an X-ray diffraction pattern of example 14 is shown in FIG. 5B. Further, an X-ray diffraction pattern of comparative example 6 is shown in FIG. 6A, and an X-ray diffraction pattern of comparative example 12 is shown in FIG. 6B. Note that each vertical axis of FIG. 5A, FIG. 5B, FIG. 6A, and FIG. 6B shows natural logarithm of the number of counts. It is found that the KNN thin film of these examples and comparative examples has a complete perovskite structure, with the crystal structure formed into the pseudo-cubic structure, and is preferentially oriented to KNN (001) plane direction. Further, it is found that the Pt lower electrode is also preferentially oriented to (111) plane. Although there is a slight difference in a diffraction peak angle or intensity regarding other examples and comparative examples, almost similar diffraction patterns are shown.

[Half Width of the Rocking Curve Of (001) Plane of the KNN Thin Film]

Figure 7A:
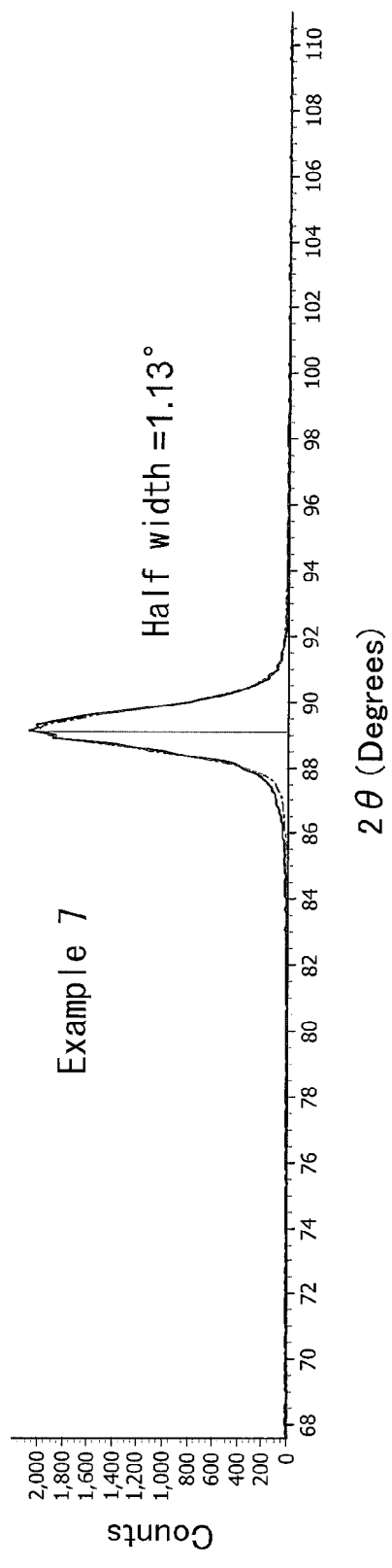
FIG. 7A is a view showing a rocking curve (ω scan) of KNN (001) plane by X-ray diffraction measurement of the piezoelectric thin film element of example 7.
Figure 7B:
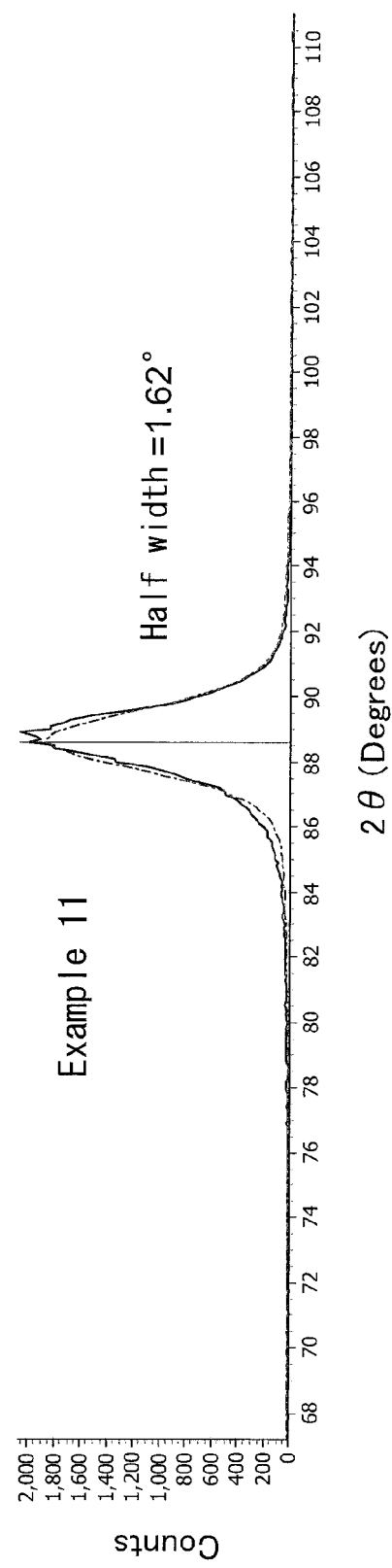
FIG. 7B is a view showing the rocking curve (ω scan) of KNN (001) plane by X-ray diffraction measurement of the piezoelectric thin film element of example 11.

The X-ray diffraction measurement (rocking curve (ω) scan) of the KNN (001) plane) was performed to each KNN thin film of examples 1 to 20 and comparative examples 1 to 14 formed as described above. As an example, rocking curves of the KNN (001) plane of example 7 and example 11 are shown in FIG. 7A and FIG. 7B, and rocking curves of the KNN (001) plane of comparative example 6 and comparative example 11 are shown in FIG. 8A and FIG. 8B, respectively. The obtained rocking curves were subjected to fitting by Pseudo-Voigt function, and thereafter the half widths thereof were read. In FIG. 7A, FIG. 7B, FIG. 8A, and FIG. 8B, measured rocking curves are shown by solid line, and fitted curves of Pseudo-Voigt function are shown by chain line. Half widths of the rocking curves of all examples and comparative examples are shown in table 1.

From the table 1, it can be confirmed that as the distance between the magnet and the target is smaller, the half width of the rocking curve of KNN (001) tends to be smaller, and as the distance between the magnet and the target is larger, the half width of the rocking curve of KNN (001) tends to be larger. There is an example excluded from such a tendency, and it can be considered that this is because there is a difference in an orientation state of (111) plane of the lower Pt electrode (difficult to be strictly controlled) or there is a difference in Na composition (composition ratio x) of the KNN film. Note that in the examples, the film deposition is performed, so that the composition ratio (K+Na)/Nb of the KNN thin films are set to 0.7 or more and 0.94 or less.

[Experimental Production of the Actuator and an Evaluation of the Piezoelectric]

Figure 9A:
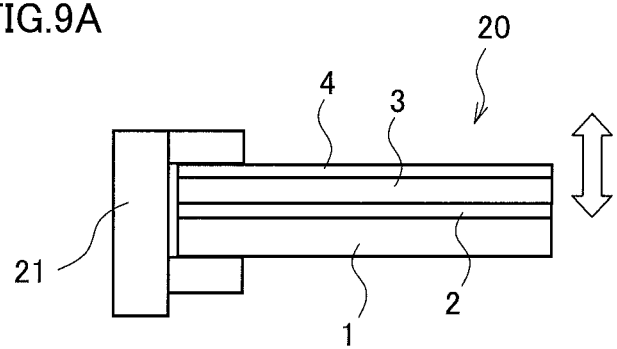
FIG. 9A is a configuration diagram showing an actuator fabricated by using the piezoelectric thin film element of examples and comparative examples.
Figure 9B:
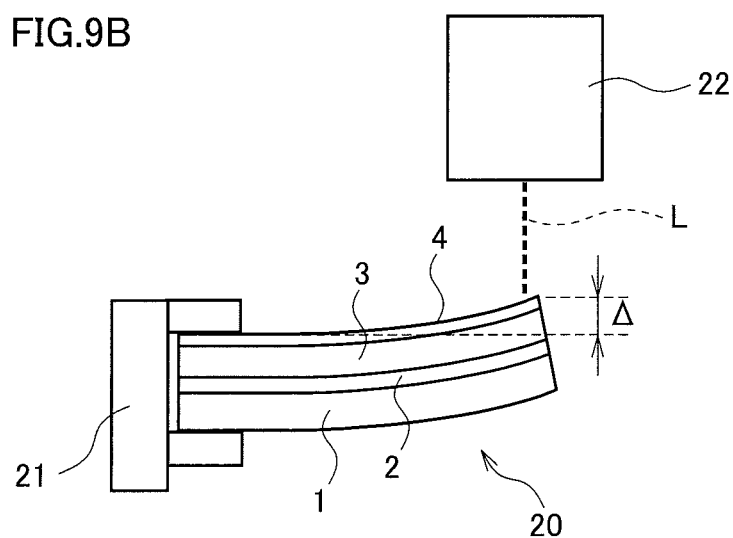
FIG. 9B is a view explaining a measurement method of the piezoelectric properties by the actuator of FIG. 9A.

In order to evaluate the piezoelectric constant $d_{31}$ of the KNN thin film, a unimorph cantilever with a structure shown in FIG. 9A and FIG. 9B was made experimentarily. First, Pt upper electrode (film thickness: 20 nm) was formed on each KNN piezoelectric thin film of the examples and the comparative examples by RF magnetron sputtering, which was then cut-out into rectangular beams (reed shape) with a length of 20 mm and a width of 2.5 mm, to thereby fabricate a piezoelectric thin film element 20 having the KNN piezoelectric thin film. Next, longitudinal one end of the piezoelectric thin film element 20 is fixed by clamp 21, to thereby fabricate a simple unimorph cantilever (FIG. 9A). Voltage is applied to the KNN piezoelectric thin film 3 between the upper electrode 4 and the lower electrode 2 of the cantilever by using a function generator not shown, and the KNN piezoelectric thin film 3 is expanded and contracted, to thereby bend and stretch an entire body of the cantilever (piezoelectric thin film element 20) and cause a tip end of the cantilever to move reciprocally in a vertical direction (in a thickness direction of the KNN piezoelectric thin film 3). Displacement amount Δ of the tip end of the cantilever at this time was measured by irradiating the tip end of the cantilever with laser light L from a laser Doppler displacement meter 21 (FIG. 9B). The piezoelectric constant $d_{31}$ can be calculated from the displacement amount Δ of the tip end of the cantilever, a length of the cantilever, a thickness and Young's modulus of the substrate 1 and the KNN piezoelectric thin film 3, and an applied voltage. The Young's modulus 104 GPa of the KNN piezoelectric thin film was used, and the piezoelectric constant $d_{31}$ with applied electric field set to 100 kV/cm was measured. The piezoelectric constant $d_{31}$ was calculated by a method described in a document (T. Mino, S. Kuwajima, T. Suzuki, I. Kanno, H. Kotera, and K. Wasa, Jpn. J. Appl. Phys., 46 (2007), 6960.). Results of measuring the piezoelectric constant $d_{31}$ are shown in table 1.

Further, current-voltage properties and insulating performance were examined by measuring the leak current when the voltage was applied between the upper and lower electrodes. An indication of right and wrong of the insulating performance was judged by the value of the leak current that flows when the electric field of 50 kV/cm was applied to the KNN piezoelectric thin film. Generally, the insulating performance is judged to have no problem when the leak current is $1 \times 10^{-7}$ (A/cm$^2$) or less. Further, by continuously applying unipolar sine wave (frequency: 1 kHz) of 0 to 20V between the upper and lower electrodes, the cantilever is continuously driven and the piezoelectric constant $d_{31}$ after drive of one hundred million number of times was measured. In this specification, {"initial piezoelectric constant $d_{31}$"-"piezoelectric constant $d_{31}$ after drive of one hundred million number of times"}/"initial piezoelectric constant $d_{31}$"}×100 was defined as the deterioration rate (%) after drive of one hundred million number of times. The leak current at the time of applied electric field of 50 kV/cm, and the deterioration rate after drive of one hundred million number of times, are shown in table 1. Further, based on the table 1, a graph for plotting a relation between the half width of the rocking curve of KNN (001) and the leak current at the time of applied electric field of 50 kV/cm, is shown in FIG. 10, and a graph for plotting a relation between the half width of the rocking curve of KNN (001) and the deterioration rate after drive of one hundred million number of times, is shown in FIG. 11.

Figure 10:
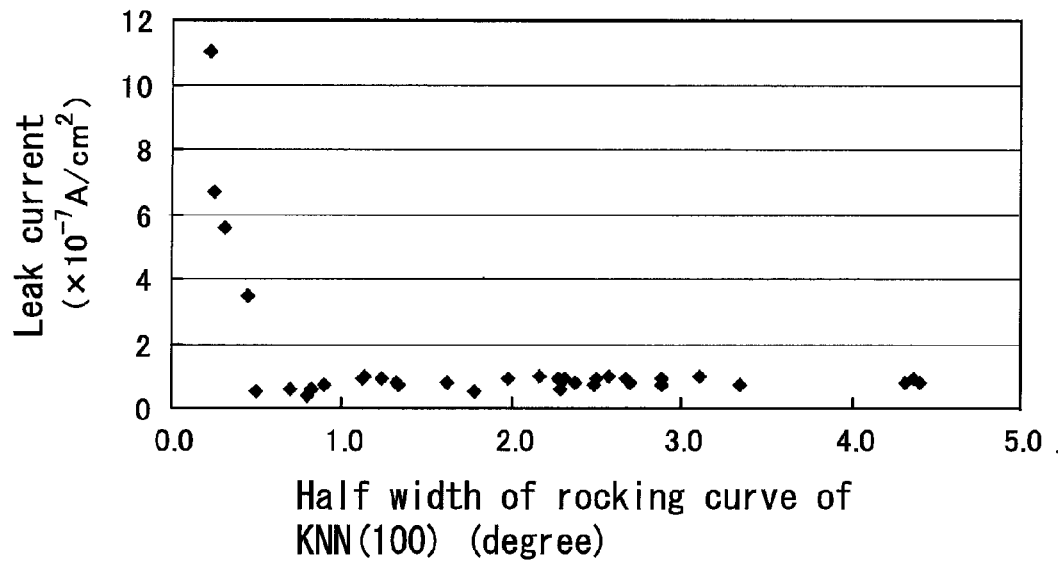
FIG. 10 is a graph showing relations between half widths of the rocking curves of KNN (001) plane, and leak currents at the time of applied electric field of 50 kV/cm.
Figure 11:
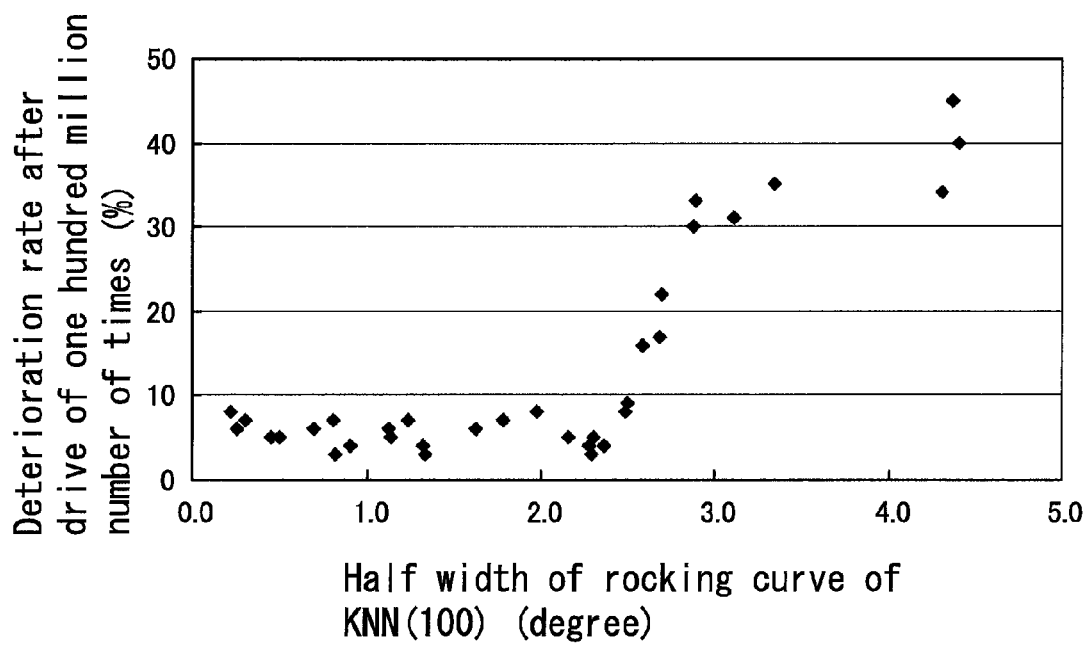
FIG. 11 is a graph showing relations between half widths of the rocking curves of the KNN (001) plane, and deterioration rates after drive of one hundred million number of times.

From the table 1, FIG. 10, and FIG. 11, it was found that the leak current is great when the half width of the rocking curve of KNN (001) is smaller than 0.5°, and the deterioration rate after drive of one hundred million number of times is great when the half width of the rocking curve of KNN (001) is larger than 2.5°. From this fact, it is found that when the half width of the rocking curve of (001) of the KNN thin film is in a range of 0.5° or more and 2.5° or less, the piezoelectric thin film element can be realized wherein the leak current is small such as $1.0 \times 10^{-7}$ (A/cm$^2$), and the deterioration rate after drive of one hundred million number of times is also small such as less than 10%. Meanwhile, the piezoelectric constant $d_{31}$ has a tendency of increasing gradually, with an increase of the half width of the rocking curve of KNN (001).

Note that in the aforementioned examples, the Si substrate with a size of 20 mm×20 mm is used as the substrate. However, the Si substrate with larger area such as a substrate with a size of 4 inches or 6 inches may also be used. When the substrate with a size of 4 inches or 6 inches is used, in order to improve in-plane uniformity, the film deposition is performed while rotating and revolving the substrate, or regarding the substrate temperature, a plurality of different heater heating zones are provided, to thereby perform film deposition by controlling a heating temperature step by step in an area of 2 inches, an area from 2 inches to 4 inches, and an area from 4 inches to 6 inches, in a radial direction from a center of the substrate. Further, uniform film deposition on the substrate with large area is realized, by setting the distance between a sputtering target and the substrate from 100 mm to 150 mm, in accordance with a size of the substrate. Even when the substrate with large area is used, it is confirmed that an element with small leak current such as $1.0 \times 10^{-7}$ (A/cm$^2$) or less and small deterioration rate after drive of one hundred million number of times such as less than 10%, can be obtained, in a range of the rocking curve of the KNN thin film being 0.5° or more and 2.5° or less.

"D8 DISCOVER with GADDS" by Bruker AXS Corporation, being the X-ray Diffractometer on which two-dimensional detector having X-ray detection area of a large area is mounted, was used for analyzing the structure of the piezoelectric thin film element according to the aforementioned examples.

What is claimed is:

1. A piezoelectric thin film element, comprising:
a piezoelectric thin film on a substrate, having an alkali-niobium oxide-based perovskite structure expressed by a composition formula $(K_{1-x}Na_x)_yNbO_3$,
wherein the composition ratio x of the piezoelectric thin film expressed by $(K_{1-x}Na_x)_yNbO_3$ is in a range of $0.4 \leq x \leq 0.7$, and a half width of a rocking curve of (001) plane by X-ray diffraction measurement is in a range of 0.5° or more and 2.5° or less.

2. The piezoelectric thin film element according to claim 1, wherein the piezoelectric thin film has a pseudo-cubic crystal structure.

3. The piezoelectric thin film element according to claim 1, wherein the piezoelectric thin film has a pseudo-cubic crystal structure, and is preferentially oriented to (001) plane direction.

4. The piezoelectric thin film element according to claim 1, wherein a composition ratio (K+Na)/Nb of the piezoelectric thin film is in a range of 0.7 or more and 0.94 or less.

5. The piezoelectric thin film element according to claim 1, comprising:
a lower electrode at the substrate side of the piezoelectric thin film; and
an upper electrode at an opposite side to the substrate of the piezoelectric thin film.

6. The piezoelectric thin film element according to claim 5, wherein the lower electrode is made of platinum, and is preferentially oriented to (111) plane direction.

7. A piezoelectric thin film device, comprising:
a lower electrode provided on a substrate;
a piezoelectric thin film provided on the lower electrode, having an alkali-niobium oxide-based perovskite structure expressed by a composition formula $(K_{1-x}Na_x)_yNbO_3$, with the composition ratio x being in a range of $0.4 \leq x \leq 0.7$, and a half width of a rocking curve of (001) plane by X-ray diffraction measurement being in a range of 0.5° or more and 2.5° or less;
an upper electrode provided on the piezoelectric thin film; and
a function generator or a voltage detection unit connected between the lower electrode and the upper electrode.

* * * * *